United States Patent
Lagerblom et al.

(12) 
(10) Patent No.: US 6,639,950 B1
(45) Date of Patent: Oct. 28, 2003

(54) METHOD AND ARRANGEMENT FOR CORRECTING PHASE ERROR IN LINEARIZATION LOOP OF POWER AMPLIFIER

(75) Inventors: Niklas Lagerblom, Espoo (FI); Kristian Thomasson, Espoo (FI)

(73) Assignee: Nokia Networks Oy, Espoo (FI)

(*) Notice: Subject to any disclaimer, the term of this patent is extended or adjusted under 35 U.S.C. 154(b) by 0 days.

(21) Appl. No.: 09/581,940
(22) PCT Filed: Oct. 22, 1999
(86) PCT No.: PCT/FI99/00883
§ 371 (c)(1), (2), (4) Date: Jun. 20, 2000
(87) PCT Pub. No.: WO00/25421
PCT Pub. Date: May 4, 2000

(30) Foreign Application Priority Data

Oct. 23, 1998 (FI) ................................................. 982298

(51) Int. Cl.$^7$ ................................................. H03F 1/32
(52) U.S. Cl. ........................ 375/297; 330/107; 455/126
(58) Field of Search ............................... 375/296, 297; 330/107, 109, 291, 149, 302; 455/115, 116, 117, 126, 127; 332/107, 123, 162

(56) References Cited

U.S. PATENT DOCUMENTS

| | | | |
|---|---|---|---|
| 5,066,923 A | | 11/1991 | Gailus et al. |
| 5,175,879 A | | 12/1992 | Ellingson et al. |
| 5,559,468 A | * | 9/1996 | Gailus et al. ................ 330/110 |
| 5,675,286 A | * | 10/1997 | Baker et al. ................. 330/129 |
| 5,920,808 A | * | 7/1999 | Jones et al. ................. 455/127 |
| 5,959,500 A | * | 9/1999 | Garrido ....................... 330/151 |
| 6,253,066 B1 | * | 6/2001 | Wilhite et al. ............... 455/108 |

FOREIGN PATENT DOCUMENTS

| | | |
|---|---|---|
| EP | 598 585 | 5/1994 |
| EP | 706 259 | 4/1996 |
| WO | WO 92/20147 | 11/1992 |
| WO | WO 98/00908 | 1/1998 |

\* cited by examiner

Primary Examiner—Don N. Vo
(74) Attorney, Agent, or Firm—Pillsbury Winthrop LLP

(57) ABSTRACT

A method and arrangement for correcting a phase error in a linearization loop of a power amplifier, the loop comprising an I/Q modulator (10), one or more delay-causing power amplifiers (13) to be linearized, an I/Q demodulator (11) for generating I and Q feedback signals from the output signals of the amplifier (13), difference means (20, 21) of the I and Q branches for generating I and Q difference signals from the I and Q feedback signals and the I and Q input signals, the I/Q modulator and the I/Q demodulator receiving an oscillator frequency from the same local oscillator (14), and a phase shifter (17), the method comprising determination of a phase error resulting from the delay produced in the linearization loop, which determination comprises feeding excitation signals to the I and Q inputs (I_IN, Q_IN) of the linearization loop, measuring the signals resulting from the excitation signals and calculating a phase error by means of the measured signals and excitation signals, and correcting the phase error by adjusting a phase of a local oscillator signal passing to the I/Q modulator or I/Q demodulator by means of a phase shifter (17), whereby on determining the phase error the signals resulting from the excitation signals are measured from the I and Q difference signals or the I and Q input signals of the I/Q modulator (10) and the phase determination is performed while the linearization loop is closed.

11 Claims, 2 Drawing Sheets

METHOD AND ARRANGEMENT FOR CORRECTING PHASE ERROR IN LINEARIZATION LOOP OF POWER AMPLIFIER

This application is the national phase of international PCT/FI99/00883 filed Oct. 22, 1999 which designated the U.S.

BACKGROUND OF THE INVENTION

The invention relates to amplifiers and in particular to a method and arrangement for linearizing power amplifiers.

Linearized amplifiers are needed, for instance, for modern digital wireless communication systems, because of the requirement that the spectrum of a signal to be transmitted must not spread outside the actual useful band. Spreading of the spectrum results from non-linearity of amplifiers and it causes interference to adjacent channels, for instance. The linearity of amplifying stages depends on how they are biased and they can be classified according to linearity: a class A amplifier is the most linear but its efficiency is poor, whereas a class C amplifier's efficiency is good but it is at the same time highly non-linear. Good efficiency is an important property in power amplifiers, and this is particularly emphasized in wireless communication devices whose battery capacity is limited. Therefore, amplifiers that have good efficiency but are non-linear and need to be linearized are used.

One known method of linearizing a non-linear radio-frequency power amplifier is Cartesian feedback. In broad outline, its operational principle is as follows: data to be transmitted is included in baseband signals I and Q. These signals are applied to an I/Q modulator, in which the signals are combined and modulated directly to a final frequency. The final-frequency signal is amplified by one or more non-linear radio-frequency power amplifiers and passed to an antenna. The amplified radio-frequency signal is sampled after the last amplifying stage by a directional coupler, for instance. The sample signal is applied to the I/Q modulator, in which it is demodulated to the baseband, and the I and Q signals are separated therefrom. The baseband I and Q sample signals are finally summed to the actual I and Q signals. This causes predistortion in the I and Q signals, thanks to which the non-linearity produced in the power amplifiers is at least partly cancelled.

In the above-described arrangement, both the I/Q modulator and the I/Q demodulator receive a local oscillator signal from the same source. On the other hand, the power amplifiers cause delay and the sampled I and Q signals return in a wrong phase. This distortion can be compensated by adjusting the phase of the local oscillator signal applied to the I/Q modulator or I/Q demodulator considering the delay produced in the power amplifiers. In order that the phase error could be corrected, its magnitude has to be measured first. EP 0 706 259 A1 discloses one method of measuring and correcting a phase error in a Cartesian feedback loop. According to the method, the loop is broken for the duration of measuring and the measuring is performed by feeding excitation signals to the I and Q inputs of the loop and by measuring the resultant signals at the outputs of the I/Q demodulator, and further, by calculating a phase error from the measurement results. The method has a drawback that the loop has to be broken for the duration of the measuring, and consequently switches are required for both feedback branches. Further, the transmitter has to be turned off when operating the switches, in order for the transmission spectrum not to spread. Moreover, amplification of an open loop is typically much higher than amplification of a corresponding closed loop, whereby the effect of DC offsets of baseband operational amplifiers and noise on the accuracy achieved with phase measuring is rather high. Amplification of the open loop also varies much more than amplification of the closed loop, and consequently it is difficult to carry out phase measuring at a given power level. U.S. Pat. No. 5,175,879 discloses phase adjustment of a loop on a continuous basis the loop being in a normal closed state. The method employs a phase detector between the input of a linearization loop and the output of an I/Q demodulator. From the output of the phase detector, a phase difference signal is further generated by means of an integrator for a phase shifter which corrects the phase. One drawback of the method is, for instance, that while turning the amplifier on, the linearization loop may jitter and cause spectrum spreading. Discontinuities of the phase shifter would also cause problems to the implementation.

BRIEF DESCRIPTION OF THE INVENTION

The object of the invention is thus to provide a method to the effect that the above-described problems can be solved. This is achieved by a method for correcting a phase error in a linearization loop of a power amplifier, the loop comprising an I/Q modulator, one or more delay-causing power amplifiers to be linearized, an I/Q demodulator for producing I and Q feedback signals from the amplifier output signal, difference means of the I and Q branches for producing I and Q difference signals from the I and Q feedback signals and the I and Q input signals, the I/Q modulator and the I/Q demodulator receiving an oscillator frequency from the same local oscillator, and a phase shifter, the method comprising determination of a phase error resulting from delay produced in the linearization loop, which determination comprises feeding excitation signals to the I and Q inputs of the linearization loop, measuring the signals resulting from the excitation signals and calculating the phase error by means of the measured signals and excitation signals, and correcting the phase error by adjusting a phase of a local oscillator signal passing to the I/Q modulator or I/Q demodulator by means of the phase shifter, whereby the method is characterized in that when determining the phase error, the signals resulting from the excitation signals are measured from the I and Q difference signals or from the I and Q input signals of the I/Q modulator and that the phase error determination is performed the linearization loop being closed.

The invention is based on the idea that when using DC excitation signals the phase error can be readily calculated from the I and Q baseband signals of the linearization loop. A deviation of the measured resultant vector angle from the input vector angle indicates directly the phase error. By performing the measuring with a plurality of I and Q input signal combinations, the phase errors of the branches can be averaged. When the excitation signals are applied to the I and Q inputs of the linearization loop and the I and Q difference signals or I/Q modulator input signals are used as measuring signals, the phase error can be measured and compensated the linearization loop being closed.

The method of the invention has an advantage that the phase of the linearization loop can be adjusted in a normal mode on an accurately defined power level the loop being closed. The event of measuring and adjusting will not make the spectrum spread harmfully to adjacent channels. At the modulator input, signal levels are typically high, whereby interference signals do not cause considerable errors in measuring.

The invention also relates to a linearization arrangement of a power amplifier, the arrangement comprising difference means, which form I and Q difference signals out of the actual I and Q input signals and I and Q feedback signals of the linearization loop, an I/Q modulator, in which the data-containing baseband I and Q difference signals received from the difference means are combined and modulated to a final frequency, one or more delay-causing power amplifiers to be linearized by which the final-frequency signal is amplified whereafter it is applied to an antenna to be transmitted, a sampling arrangement, by which a sample signal is taken from the amplified final-frequency signal prior to the antenna, an I/Q demodulator, to which said sample signal is applied and in which the sample signal is demodulated to the baseband and the I and Q sample signals which form said I and Q feedback signals are separated therefrom, a local oscillator, from which a local oscillator signal is applied to the I/Q modulator and I/Q demodulator and a phase shifter, by which the phase of the local oscillator signal passing to the I/Q modulator or I/Q demodulator is shifted for compensating the phase error of the linearization loop, the arrangement being arranged to determine the phase error by applying DC excitation signals to the I and Q inputs of the difference means of the linearization loop and by measuring the resultant signals, and to calculate the phase error resulting from the delay in the linearization loop by means of the measured signals and the excitation signals, and to correct the determined phase error, whereby the linearization arrangement is characterized by being arranged to measure the signals resulting from the excitation signals from the I and Q difference signals or the I and Q input signals of the I/Q modulator when determining the phase error, and by being arranged to determine the phase error while the linearization loop is closed.

By means of a linearization arrangement like this, the method of the invention can be implemented by simple circuitries.

BRIEF DESCRIPTION OF THE DRAWINGS

In the following, the invention will be described in greater detail in connection with preferred embodiments with reference to the attached drawings in which.

DETAILED DESCRIPTION OF THE INVENTION

Figure 1:
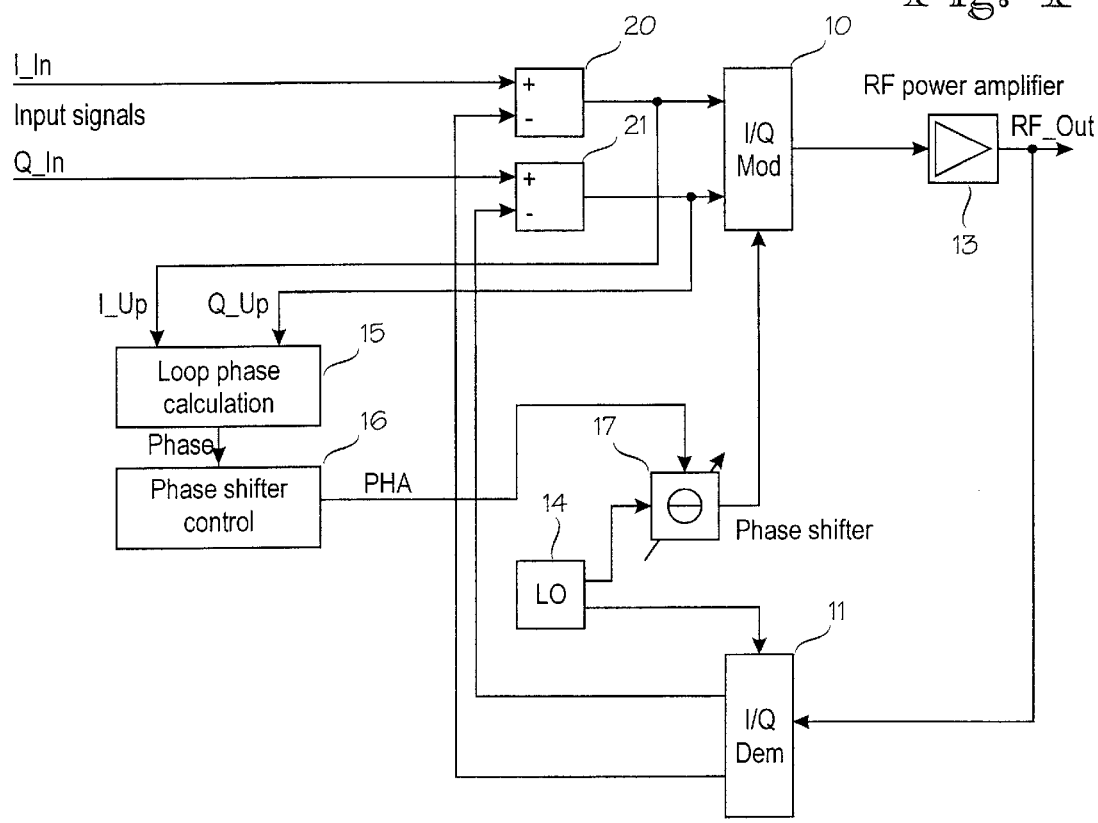
FIG. 1 is a block diagram of a linearization arrangement of a transmitter power amplifier in accordance with one embodiment of the invention.

A linearization arrangement of a transmitter power amplifier in accordance with FIG. 1 comprises, in broad outline, an I/Q modulator 10, an I/Q demodulator 11, at least one power amplifier 13 to be linearized, a local oscillator 14, a loop phase calculation unit 15, a phase shifter control unit 16 and a phase shifter 17. The I/Q modulator 10 and the I/Q demodulator 11 operate on a quadrature modulation principle. It enables two separate signals to be combined in a transmitter and to be transmitted on the same transmission band and to be separated again from one another in a receiver. The principle of the quadrature modulation is that two separate signals, I and Q (Inphase and Quadrature phase), are modulated using the same carrier frequency, but the phases of the carriers deviate from one another in such a manner that the carrier of the signal Q lags 90° behind the carrier of the signal 1. After modulation, the signals are summed. Thanks to the phase difference, the signals I and Q can be separated from one another when demodulating the sum signal. For the method to function, the local oscillator signals used by the modulator and the demodulator, on the basis of which signals the carrier is formed, must be mutually of the same frequency and in a correct phase.

The baseband I and Q signals containing data are applied to the I/Q modulator 10, in which they are combined and modulated to a final frequency (transmission frequency). The final-frequency signal is forwarded to a nonlinear power amplifier 13, in which the signal is amplified. There can be a plurality of power amplifier units 13 coupled in series. After amplification, the signal RF_OUT is conveyed to an antenna (not shown) to be transmitted.

The amplified, final-frequency signal is sampled after the power amplifier 13 and applied to the I/Q demodulator 11, in which the sample signal is demodulated to the baseband and the I and Q sample signals are separated therefrom. The obtained baseband I and Q sample signals are summed to the actual I and Q signals by feeding them to summing means 20 and 21 through inverting inputs. The means 20 and 21 can thus be difference amplifiers, for instance. This predistorts the signals passing to the I/Q modulator 10 and further to the power amplifier 13 such that the non-linearity caused by the power amplifier 13 is cancelled to be as low as possible.

The local oscillator unit 14 generates an oscillator signal that is applied to the I/Q demodulator 11 and via the phase shifter 17 to the I/Q modulator 10. The phase of the local oscillator signal coming to the I/Q modulator 10 is adjusted in the phase shifter 17, since the sample signal applied to the I/Q demodulator 11 and modulated in the I/Q modulator 10 is delayed in the power amplifier 13. In order for the sample signal to be correctly demodulated, the local oscillator signal and the sample signal to be applied to the I/Q demodulator must be in a correct phase with respect to each other. The delay caused to the signal in the power amplifier is thus compensated by the phase shifter 17. Alternatively, the phase shifter can be located in a signal branch leading from the local oscillator 14 to the I/Q demodulator 11.

Figure 5:
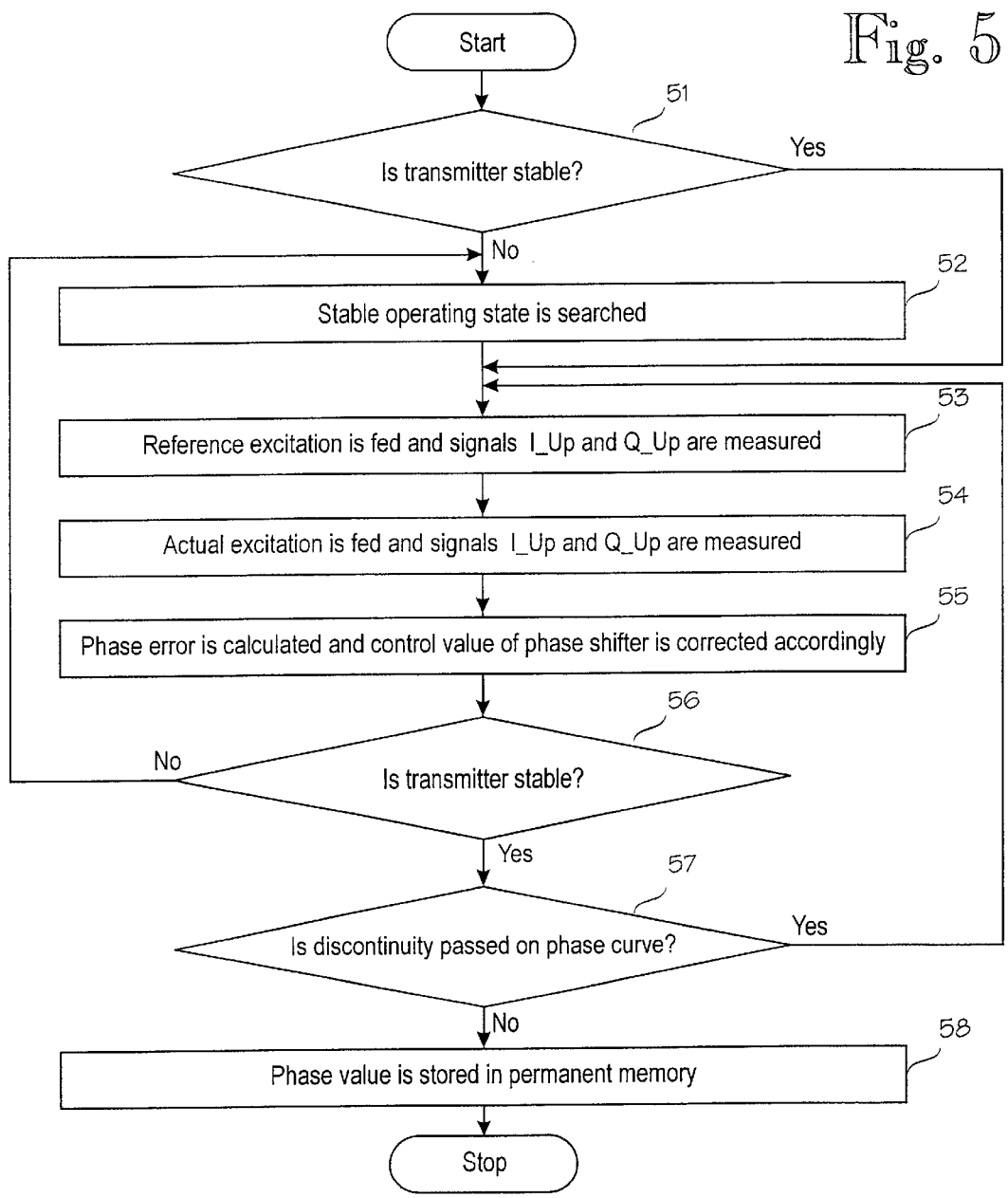
FIG. 5 is a flow chart of a phase adjustment process in accordance with one embodiment of the invention.

FIG. 5 illustrates a phase adjustment process of a preferred embodiment of the invention for one frequency. For tuning the phase parameters of the entire transmitter frequency band, the process is performed on one or more occasions at one or more frequencies, depending on the implementation of the phase shifter. The parameters tuned at different frequencies are stored in the memory of the device.

The blocks of the flow chart operate as follows:

1) It is tested whether the transmitter is stable 51.

First the transmitter is switched on. To ensure stability, the value of an oscillation detector (not shown) is checked and the signals I_UP and Q_UP are measured. The oscillation detector is based on detecting high-frequency interference signals which appear in the baseband I and Q signals of the linearization loop in the course of oscillation. If the amplitude of a high-frequency interference signal exceeds a given limit value, a conclusion can be made that the transmitter is unstable. In addition, the measured I_UP and Q_UP signals are compared with the preset limit value. If one or both of the signals exceed the limit value, the phase error of the linearization loop is about 180°, i.e. the transmitter is unstable. If the transmitter is found unstable, a new, better initial value has to be searched 52 for the phase shifter prior to phase measuring. If the transmitter is stable, a direct transfer to step 3) is performed 53.

2) A stable operating state is searched 52.

Figure 2:
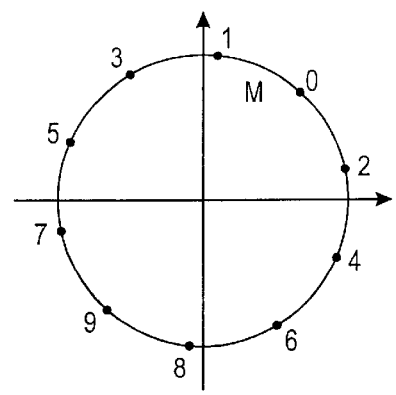
FIG. 2 illustrates operating states of a phase shifter in accordance with one embodiment of the invention.

A stable operating state is searched by using the original phase shifter 17 control value, indicated by point 0 in FIG. 2, as the initial value. In FIG. 2, the mutual distance between points 0 to 9 representing the operating state of the phase shifter 17 corresponds to a change M in the control value of the phase shifter 17. First the control value is increased by a predetermined amount M, whereby a transfer is performed to point 1 in FIG. 2 and stability is checked in the same manner as in step 1) 51. If stability is not achieved, the original control value is decreased by M, i.e. a transfer is performed to point 2 in FIG. 2. If stability is not achieved by this either, the original control value will be increased next by 2×M, i.e to point 3. Next, the original control value is decreased by 2×M, i.e. to point 4. This procedure will be repeated until a stable state is found. If a stable state is not found within the whole range of 360°, a fault report will be given and the transmitter is prevented from being started. Trial points can be any other number than the ten points used in this example.

3) A reference excitation is fed and the signals I_UP and Q_UP are measured 53.

A reference excitation is fed to the linearization loop: I_IN=0 V, Q_IN=0 V and the corresponding signals I_UP and Q_UP ( $I_{ref}$=I_UP, $Q_{ref}$=Q_UP) are measured. This is necessary to have a correct reference point for the signals to serve as a zero-point in calculation. At this stage the transmitter can be turned off (the linearization loop is broken) or on (the loop is closed). This step is not necessary. The step facilitates implementation of the device and enables better accuracy of phases. The step can be performed only in specific less frequently repeated periods than the actual phase adjustment process, for instance.

4) The actual excitation is fed to the linearization loop and the signals I_UP and Q_UP are measured 54.

The actual excitation (I_IN=$I_{in}$, Q_IN=$Q_{in}$) is fed to the linearization loop and the signals I_UP and Q_UP ($I_{meas}$= I_UP, $Q_{meas}$=Q_UP) are measured. The excitation is typically located on I/Q plane on the axes (I_IN=Vdc, Q_IN=0 or I_IN=0, Q_IN=Vdc or I_IN=−Vdc, Q_IN=0 or I_IN= 0, Q_IN=−Vdc), but it can also be located anywhere else on I/Q level. The value of the excitation signal typically corresponds to the RMS value of the I and Q signals of a normal modulated transmission. A higher or lower level signal can also be used. The power level set by transmitter power control can be any level, but the highest stability is achieved if the transmitter has the same power during the measuring as in the normal operation.

5) The phase error is calculated and the control value of the phase shifter 17 is corrected accordingly 55.

The phase error is calculated from the measured signals by following equations:

The phase angle ac of the actual excitation signals $I_{in}$ and $Q_{in}$ (FIG. 3, point A):

$$\alpha = \arctan\left[\frac{Q_{in}}{I_{in}}\right], \text{ when } I_{in} > 0 \quad (1.1)$$

$$\alpha = 180° + \arctan\left[\frac{Q_{in}}{I_{in}}\right], \text{ when } I_{in} < 0 \quad (1.2)$$

If $I_{in}$=0 and $Q_{in}$>0, then α=90° and
If $I_{in}$=0 and $Q_{in}$<0, then α=270°.
The phase angle β of the signals $I_{meas}$ and $Q_{meas}$ measured in step 4) 54 (FIG. 3, point B) is given by:

$$\beta = \arctan\left[m \times \frac{Q_{meas} - Q_{ref}}{I_{meas} - I_{ref}}\right], \text{ when } (I_{meas} - I_{ref}) > 0 \quad (2.1)$$

$$\beta = 180° + \arctan\left[m \times \frac{Q_{meas} - Q_{ref}}{I_{meas} - I_{ref}}\right], \text{ when } (I_{meas} - I_{ref}) < 0 \quad (2.2)$$

Figure 3:
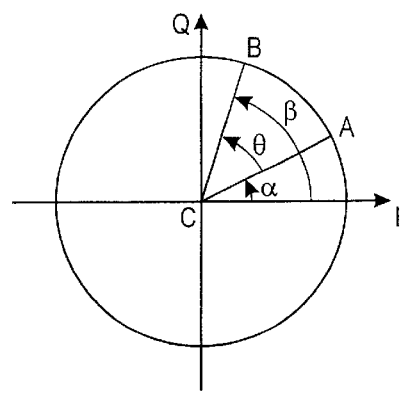
FIG. 3 illustrates phase error determination in accordance with one embodiment of the invention.

If ($I_{meas}$−$I_{ref}$)=0 and ($Q_{meas}$−$Q_{ref}$)>0, then β=90° and
If ($I_{meas}$−$I_{ref}$)=0 and ($Q_{meas}$−$Q_{ref}$)<0, then β=270° and
,where
m=1, when imbalance of I/Q amplitude is not considered and $I_{ref}$ and $Q_{ref}$=the reference points of measuring in accordance with step 3) 53 (FIG. 3, point C). If the $I_{ref}$ and $Q_{ref}$ values are not determined, they are deleted from the formulae (2.1) and (2.2), or alternatively, they are given the value zero.

The phase error θ is given by:

$$\theta = \beta - \alpha \quad (3.1)$$

CONSIDERATION OF IQ AMPLITUDE IMBALANCE

Consideration of the amplitude imbalance may be necessary, if any other vector than one in the direction of the axis I or Q is selected to act as an excitation signal. Consideration is effected as follows:

Step 1:
Excitation signal I_IN=$V_{DC1}$, and Q_IN=0
A phase is searched, the measuring signals being I_UP= the maximum and Q_UP=the minimum I_UP amplitude is measured, I_UP=N Step 2:
Excitation signal I_IN=0 and Q_IN=$V_{DC1}$
A phase is searched, the measuring signals being I_UP= the minimum and Q_UP=the maximum
Q_UP amplitude is measured, Q_UP=P Step 3:
A correction factor m is calculated $$m = \frac{N}{P}$$

which is used for calculating the phase angle β of the signal to be measured in accordance with the formulae (2.1) and (2.2).

Figure 4:
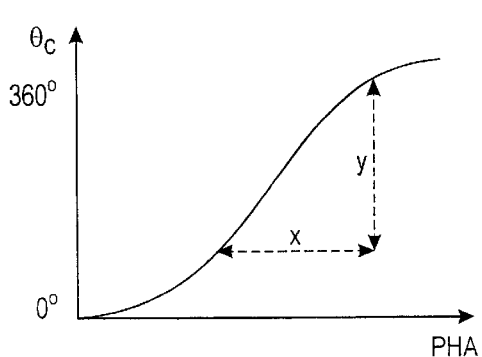
FIG. 4 illustrates a change of phase caused by a phase shifter as a function of a control value in accordance with one embodiment of the invention.

The phase error being determined, the control value of the phase shifter 17 is corrected for the magnitude of the phase error by the following equation:

$$PHA_1 = PHA_0 - \frac{\theta}{K},$$

where $PHA_1$ is the new control value of the phase shifter 17, $PHA_o$ is the old control value in store, θ is the phase error and K is the average slope of the phase shifter 17, whereby K=y/x in accordance with FIG. 4. The phase range determined by a variable y depends on the shape of the phase adjustment curve and where the 360° point is located on the curve so that the determined, average slope K would depict the phase adjustment curve of the phase shifter 17 as well as possible. The case shown in FIG. 4 is intended to illustrate the average slope K by way of example only. In FIG. 4, the axis $\theta_c$ represents a phase shift caused by the phase shifter 17 and the axis PHA represents the control value of the phase shifter 17.

6) Stability of the transmitter is tested 56 as in step 1) 51 by means of the new control value of the phase shifter 17. If the transmitter oscillates, i.e. it is not stable, a return to step 2) 52 to the beginning of the phase adjustment process is performed. If a stable state is not achieved with the following round, a fault report is given and the transmitter is prevented from being started.

7) It is checked whether a discontinuity is passed on the phase curve 57, when a transfer from the old value $PHA_0$ to a new value $PHA_1$ of the phase shifter 17 is made. If yes, a return to step 3) 53 is performed and the phase adjustment process is repeated. If the discontinuity is passed also next time, a fault report is given and the transmitter is prevented from being started.

Step 7) 57 makes it possible that the phase adjustment range of the phase shifter 17 need not be highly accurate. If a phase shifter with continuous control is used alone, the adjustment range should in practice exceed 360°, since in general the phase adjustment range of the phase shifter is not quite accurate due to various non-ideal factors. For instance, at different frequencies the same control value of the phase shifter may cause a different phase shift. The adjustment range can be, for instance, 0 to 400°, when the range 360 to 400° corresponds to the range 0 to 40°. It is ensured thereby that the complete 360° will be covered. A discontinuity refers to a point at which, like in the example, a transfer is made from the value 400° back to the starting value 0°. Also a change in the state of an optional step phase shifter can produce a discontinuity. When using a phase shifter with continuous control and step phase shifters together, the adjustment range of the phase shifter with continuous control must exceed the largest phase shift caused by the change in state of the step phase shifter in order that a continuous phase adjustment range would be achieved. If a phase shifter with continuous control, not having a discontinuity, is used, this step is not necessary. It is not relevant to the invention, how the phase shifter is implemented.

8) Finally, the obtained phase shifter control value PHA, (not shown) 58 is stored and it is utilized to control the phase shifter 17 at a given transmitter frequency range, until the phase adjustment process on said frequency range is repeated.

The phase adjustment process can be repeated (at a given frequency) several times by means of the same or different excitations, whereby the new control value of the phase shifter 17 can be deduced (e.g. by suitably averaging) from the provisional results obtained by different excitations.

There are several alternatives to implement the phase adjustment process and use it. For instance, the above-described process can be employed when initializing a transmitter (e.g. calibration for production), repeated at given intervals, when a transmitter parameter changes or on the initiative of an external excitation signal.

For instance, the available frequency band of 20 MHz can be divided into 20 sub-bands, each of which is determined to have a separate control value of the phase shifter 17.

The operations of various steps (1 to 8) of the above-described phase adjustment process can be performed between normal transmissions at a suitable moment. The whole process can be distributed to a plurality of moments, for instance, to various time slots of a TDMA transmission.

The present invention is intended for application to the TETRA (Terrestrial Trunked Radio) system, but application of the method of the invention to systems of any other type is by no means excluded. It is obvious to a person skilled in the art that as technology advances the basic idea of the invention can be implemented in a variety of ways. Thus the invention and its embodiments are not restricted to the above-described examples but they can vary within the scope of the claims.

What is claimed is:

1. A method for correcting a phase error in a linearization loop of a power amplifier, the loop comprising an I/Q modulator, one or more delay-causing power amplifiers to be linearized, an I/Q demodulator for producing I and Q feedback signals from the amplifier output signal, difference means of the I and Q branches for producing I and Q difference signals from the I and Q feedback signals and the I and Q input signals, the I/Q modulator and the I/Q demodulator receiving an oscillator frequency from the same local oscillator, and a phase shifter, the method comprising determination of a phase error resulting from delay produced in the linearization loop, which determination comprises feeding excitation signals to the I and Q inputs of the linearization loop, measuring the signals resulting from the excitation signals and calculating the phase error by means of the measured signals and excitation signals, and correcting the phase error by adjusting a phase of a local oscillator signal passing to the I/Q modulator or I/Q demodulator by means of the phase shifter, characterized in that when determining the phase error, the signals resulting from the excitation signals are measured from the I and Q difference signals or from the I and Q input signals of the I/Q modulator and that the phase error determination is performed while the linearization loop being closed.

2. A method as claimed in claim 1, characterized in that the excitation signals applied to the I and Q inputs of the linearization loop are positive or negative direct current signals and one of them can have the value of zero.

3. A method as claimed in claim 2, characterized in that a phase angle ($\alpha$) of a vector formed on the I/Q plane by the applied excitation signals is calculated.

4. A method as claimed in claim 3, characterized in that a phase angle ($\beta$) of a vector formed on the I/Q plane by the measured signals resulting from the excitation signals is calculated.

5. A method as claimed in claim 4, characterized in that an average phase error ($\theta$) is given by: $\theta = \beta - \alpha$.

6. A method as claimed in claim 5, characterized in that a control value of the phase shifter is corrected according to the phase error ($\theta$).

7. A method as claimed in claim 1, characterized in that prior to determining the phase error a stable operating state is searched for the linearization loop, if necessary.

8. A method as claimed in claim 1, characterized in that the phase error is determined from the phase errors calculated on the basis of a plurality of excitation signals having the same or different level advantageously by averaging.

9. A method as claimed in claim 1, characterized in that the phase error is determined separately for each sub-band of the frequency band used by the power amplifier.

10. A linearization arrangement of a power amplifier, the arrangement comprising
- difference means, which form I and Q difference signals out of the actual I and Q input signals and I and Q feedback signals of the linearization loop,
- an I/Q modulator, in which the data-containing, baseband I and Q difference signals received from the difference means are combined and modulated to a final frequency,
- one or more delay-causing power amplifiers to be linearized by which the final-frequency signal is amplified whereafter it is applied to an antenna to be transmitted,
- a sampling arrangement, by which a sample signal is taken from the amplified final-frequency signal prior to the antenna,
- an I/Q demodulator, to which said sample signal is applied and in which the sample signal is demodulated to the baseband and the I and Q sample signals forming said I and Q feedback signals are separated therefrom,
- a local oscillator, from which a local oscillator signal is applied to the I/Q modulator and I/Q demodulator and
- a phase shifter, by which the phase of the local oscillator signal passing to the I/Q modulator or I/Q demodulator is shifted for compensating the phase error of the linearization loop,
- the arrangement being arranged to determine the phase error by feeding direct current excitation signals to the I and Q inputs of the difference means of the linearization loop and by measuring the resultant signals, and to calculate the phase error resulting from the delay in the linearization loop by means of the measured signals and the excitation signals, and to correct the determined phase error,
- characterized by being arranged to measure the signals resulting from the excitation signals from the I and Q difference signals or the I and Q input signals of the I/Q modulator when determining the phase error,
- and by being arranged to determine the phase error while the linearization loop is closed.

11. An arrangement as claimed in claim 10, characterized in that the phase shifter comprises a phase shifter with continuous control and one or more step phase shifters.

* * * * *